(12) United States Patent
Rhodes

(10) Patent No.: US 7,910,963 B2
(45) Date of Patent: Mar. 22, 2011

(54) METHOD AND APPARATUS PROVIDING CMOS IMAGER DEVICE PIXEL WITH TRANSISTOR HAVING LOWER THRESHOLD VOLTAGE THAN OTHER IMAGER DEVICE TRANSISTORS

(75) Inventor: Howard E. Rhodes, Boise, ID (US)

(73) Assignee: Round Rock Research, LLC, Mt. Kisco, NY (US)

( * ) Notice: Subject to any disclaimer, the term of this patent is extended or adjusted under 35 U.S.C. 154(b) by 0 days.

(21) Appl. No.: 12/711,080

(22) Filed: Feb. 23, 2010

(65) Prior Publication Data

US 2010/0201860 A1 Aug. 12, 2010

Related U.S. Application Data

(60) Continuation of application No. 12/076,631, filed on Mar. 20, 2008, which is a division of application No. 11/318,510, filed on Dec. 28, 2005, now Pat. No. 7,368,339, which is a division of application No. 10/751,439, filed on Jan. 6, 2004, now Pat. No. 7,214,575.

(51) Int. Cl.
| | |
|---|---|
| H01L 29/76 | (2006.01) |
| H01L 29/94 | (2006.01) |
| H01L 31/062 | (2006.01) |
| H01L 31/113 | (2006.01) |

(52) U.S. Cl. ... 257/288; 257/204; 257/291; 257/E21.17; 257/E21.185; 257/E21.304; 257/E21.435; 257/E27.133; 257/E27.159

(58) Field of Classification Search .............. 257/68, 257/69, 71, 192, 213, 204, 291, 292, 288, 257/347, E21.17, 185, 304, 435, E27.133, 159

See application file for complete search history.

(56) References Cited

U.S. PATENT DOCUMENTS

| | | | |
|---|---|---|---|
| 5,625,210 A | 4/1997 | Lee et al. | |
| 5,869,857 A | 2/1999 | Chen | |
| 6,064,053 A | 5/2000 | Chi | |
| 6,180,969 B1 | 1/2001 | Yang et al. | |
| 6,184,055 B1 | 2/2001 | Yang et al. | |
| 6,204,524 B1 | 3/2001 | Rhodes | |
| 6,218,691 B1 | 4/2001 | Chung et al. | |
| 6,310,366 B1 | 10/2001 | Rhodes et al. | |
| 6,320,617 B1 | 11/2001 | Gee et al. | |
| 6,326,652 B1 | 12/2001 | Rhodes | |
| 6,329,679 B1 | 12/2001 | Park | |
| 6,441,412 B2 | 8/2002 | Oh et al. | |
| 6,469,332 B1 | 10/2002 | Berezin | |
| 6,492,694 B2 | 12/2002 | Noble et al. | |

(Continued)

FOREIGN PATENT DOCUMENTS

EP 0 738 010 A2 10/1996

(Continued)

*Primary Examiner* — David Nhu
(74) *Attorney, Agent, or Firm* — Lerner, David, Littenberg, Krumholz & Mentlik, LLP

(57) ABSTRACT

A transistor of a pixel cell for use in a CMOS imager with a low threshold voltage of about 0.3 V to less than about 0.7 V is disclosed. The transistor is provided with high dosage source and drain regions around the gate electrode and with the halo implanted regions and/or the lightly doped LDD regions and/or the enhancement implanted regions omitted from at least one side of the gate electrode. The low threshold transistor is electrically connected to a high voltage transistor with a high threshold voltage of about 0.7 V.

16 Claims, 9 Drawing Sheets

U.S. PATENT DOCUMENTS

| | | |
|---|---|---|
| 6,531,725 B2 | 3/2003 | Lee et al. |
| 6,642,076 B1 | 11/2003 | Yaung et al. |
| 6,690,000 B1 | 2/2004 | Muramatsu et al. |
| 6,908,839 B2 | 6/2005 | Rhodes |
| 6,949,388 B2 | 9/2005 | Park |
| 6,974,943 B2 | 12/2005 | Manabe et al. |
| 7,022,965 B2 | 4/2006 | Manabe et al. |
| 7,057,656 B2 | 6/2006 | Lee |
| 7,214,575 B2 | 5/2007 | Rhodes |
| 7,368,339 B2 | 5/2008 | Rhodes |
| 7,397,075 B2 | 7/2008 | Rhodes |
| 2005/0040393 A1* | 2/2005 | Hong .............. 257/40 |

FOREIGN PATENT DOCUMENTS

| | | |
|---|---|---|
| EP | 1 223 623 A2 | 7/2002 |
| JP | 2000-175107 A | 6/2000 |
| JP | 2003-234496 A | 8/2003 |

* cited by examiner

METHOD AND APPARATUS PROVIDING CMOS IMAGER DEVICE PIXEL WITH TRANSISTOR HAVING LOWER THRESHOLD VOLTAGE THAN OTHER IMAGER DEVICE TRANSISTORS

This application is a continuation of U.S. patent application Ser. No. 12/076,631, filed Mar. 20, 2008, which is a divisional of U.S. patent application Ser. No. 11/318,510, filed Dec. 28, 2005, now U.S. Pat. No. 7,368,339, which is a divisional of U.S. patent application Ser. No. 10/751,439 filed Jan. 6, 2004, now U.S. Pat. No. 7,214,575, all of which are hereby incorporated by reference in their entireties.

FIELD OF THE INVENTION

The present invention relates to the field of semiconductor imaging devices and, in particular, to a pixel cell transistor for improving output signal efficiency of a pixel cell.

BACKGROUND OF THE INVENTION

In a conventional CMOS imager, the active elements of a pixel cell perform the necessary functions of: (1) photon to charge conversion; (2) accumulation of image charge; (3) transfer of charge to the floating diffusion node accompanied by charge amplification; (4) resetting the floating diffusion node to a known state before the transfer of charge to it; (5) selection of a pixel for readout; and (6) output and amplification of a signal representing pixel charge. Photo charge may be amplified when it moves from the initial charge accumulation region to the floating diffusion node through a transfer transistor. The charge at the floating diffusion node is converted to a pixel output voltage by a source follower output transistor.

Exemplary CMOS imaging circuits as well as detailed descriptions of the functions of various CMOS elements of an imaging circuit are described, for example, in U.S. Pat. No. 6,204,524 to Rhodes, U.S. Pat. No. 6,310,366 to Rhodes et al. and U.S. Pat. No. 6,326,652 to Rhodes, the disclosures of which are incorporated by reference herein.

A schematic view of an exemplary CMOS pixel three-transistor (3T) pixel cell 10 is illustrated in FIG. 1. The three transistors include reset transistor 32, source follower transistor 36 and row select transistor 38. A floating diffusion region 30 receives charge form a photosensor 25 and is connected to the source follower transistor 36 by a contact line 44 which is typically a metal contact line. The source follower transistor 36 outputs a signal proportional to the charge accumulated in the floating diffusion region 30 to a readout circuit when the row select transistor 38 is turned on. The reset transistor 32 resets the floating diffusion node to a known potential prior to transfer of charge thereto from photosensor 25. Photosensor 25 may be a photodiode, a photogate, or a photoconductor. If a photodiode is employed, the photodiode may be formed below a surface of the substrate and may be a buried p-n-p photodiode, buried n-p-n photodiode, a buried p-n photodiode or a buried n-p photodiode, among others.

FIG. 2 is a more detailed illustration of the source follower transistor 36 of the 3T pixel cell 10 of FIG. 1 as fabricated within a semiconductor substrate 16. As shown in FIG. 2, the source follower transistor 36 is formed in semiconductor substrate 16 having a doped well 20 of a first conductivity type, which for exemplary purposes is treated as a p-type. Field oxide regions 15, which serve to surround and isolate the pixel cell 10, are formed by any known technique such as thermal oxidation of the underlying silicon in a LOCOS process, or by etching trenches and filling them with oxide in an STI process.

A p-type blanket or masked enhancement implant may be conducted to implant p-type dopants at an implant dose of about $1\times10^{11}/cm^2$ to $1\times10^{13}/cm^2$ to help set the voltage threshold of the NMOS transistor to be built in the active areas. This implant is typically conducted after pad oxidation, prior to gate oxidation, or after polysilicon gate deposition.

Subsequent to the blanket enhancement implant and the formation of the gate stack of the transistor 36 of FIG. 2, a first implant is conducted to form lightly doped drain (LDD) regions 22 of the drain and source on either side of the gate stack of transistor 36. For NMOS devices, this light implant may be conducted with an n-type doping, typically a phosphorous or arsenic doping, preferably arsenic, at a dose concentration of about $1\times10^{12}/cm^2$ to $5\times10^{13}/cm^2$, more preferably $2\times10^{12}/cm^2$ to $1\times10^{13}/cm^2$. The first implant is self-aligned to the gate stack of the source follower transistor 36. This can be an angled implant at four orthogonal wafer rotations.

Next, a second halo angled implant is conducted to implant p-type dopants, for example boron or boron difluoride, adjacent the LDD regions 22 and to form halo implanted regions 25, as illustrated in FIG. 2. The halo implant is initially conducted on one side of the device. Upon completion, the device may be rotated 180 degrees and the halo implant process may then be repeated to form a halo implanted region 25 on the opposite side. In practice, the gate stack of the source follower transistor 36 may be subjected to four halo implants during processing. Four implants are typically performed because many of the transistors formed above the substrate are oriented at different angles relative to one another.

Sidewall spacers 35 are then formed and a heavier dose n-type implant is conducted to form low-resistivity source/drain regions 23 (FIG. 2) which merge with the lighter doped regions 22 and halo implanted regions 25. In NMOS devices, this heavier dose implant is an n-type implant, typically an arsenic implant, at a dosage of about $5\times10^{14}/cm^2$ to about $1\times10^{16}/cm^2$. This implant is self-aligned to sidewall oxide spacers 35 formed by known methods on the sidewalk of the gate stack of the source follower transistor 36. This n-type doping implant serves to convert a portion of the p-type region to an n-type region and also to form deeper n-type regions on either side of the transistor gate. The reset transistor of the pixel cell is similarly fabricated.

By employing the above-described angled halo implant and enhancement implant in addition to the LDD implant, short-channel effects are minimized, degradation in the threshold voltage is reduced, and the electric field is decreased to an acceptable level near the edges of the gate of transistor 36. More specifically, by "reinforcing" the p-type doping of the p-type well 20 of the semiconductor substrate 16 in the channel between the n-type doped LDD regions 22, the p-type doped angled halo implanted regions 25 improve the "threshold voltage Vt roll-off," that is defined as the decrease of Vt as a function of the decrease in the gate length. Thus, short-channel induced effects such as drain/source leakage current when the transistor is switched "off" (i.e., "off-state" leakage) are reduced.

The above-described halo, enhancement and LDD implants provide a threshold voltage which, for the source follower transistor 36, limits the signal output swing which can be obtained from the pixel cell. That is, the maximum output signal is ($V_{DD}$–Vt). Accordingly, the higher the Vt the lower the maximum signal swing. Thus, for example, if $V_{DD}$=3.3 V and Vt=0.8 V, the maximum swing voltage of the source follower transistor 36 is limited to 2.5 V. Similarly, the higher threshold voltage Vt for the reset transistor 32 limits reset voltage which can be applied to the floating diffusion region 30. The resulting reduction of the maximum output swing of the pixel cell 10 due to the combined Vts of the reset and source follower transistors becomes ($V_{DD}$−2×Vt), or 1.7 V.

As pixel cells are scaled down, it becomes more desirable to increase the maximum swing voltage for the source follower transistor and the maximum reset voltage applied to the floating diffusion region by the reset transistor. Lower threshold voltages for other pixel transistors may also be desirable.

SUMMARY OF THE INVENTION

In one aspect, the invention provides a pixel cell in which at least one operating transistor thereof has a lower threshold voltage than that of other transistors employed in an imager device containing the pixel cell.

In another aspect, the invention provides a pixel cell in which at least one transistor which could be, for example, a reset transistor or a source follower or a row select transistor, has a lower threshold voltage than that of other transistors employed in an imager device containing the pixel cell.

In another aspect, the invention provides a method of fabricating a transistor of a pixel cell which has a lower threshold voltage than that of other fabricated transistors of an imager device containing the pixel cell. The transistor having the lower threshold voltage may be, for example, one or more of a transfer, source follower, reset transistor or row select transistor of the pixel cell. This invention, however, is not to be limited by these specific transistor examples but is to be broader and to refer to any transistor of the pixel.

In another aspect of the invention, at least one transistor of a pixel cell may be formed to have a lower threshold voltage than that of other transistors employed in an imaging device containing the pixel cell by eliminating at least one of a halo implant, an enhancement implant and an LDD implant on at least one side of the gate of the transistor. The transistor may be one or more of a transfer, source follower, reset transistor and row select transistor. In a preferred embodiment, a pixel transistor threshold voltage is reduced to about 0.3-0.7 V from the more typical 0.8 V threshold voltage.

In one embodiment, the lower threshold voltage of at least one of the pixel cell transistor is achieved by omitting a halo implant on at least one side of the gate of the transistors. If desired, the omission of the halo implant may be conducted in addition to the elimination of an LDD implant and/or of an enhancement implant. In another embodiment, the lower threshold voltage is achieved by omitting an LDD implant on at least one side of the gate of the transistors. If desired, the omission of the LDD implant may be conducted in addition to the elimination of a halo implant and/or of an enhancement implant. In yet another embodiment, the lower threshold voltage is achieved by omitting an enhancement implant on at least one side of the gate of the transistors. The omission of the enhancement implant may be conducted in addition to the elimination of the halo implant and/or of LDD implant.

Transistors having the lowered threshold voltage are formed by omitting at least one of the halo implants, enhancement implants and LDD implants on at least one side of the gate stacks during fabrication, while other transistors of the imager device having a higher threshold voltage receive the conventional halo implants, enhancement implants and LDD implants on opposite sides of a gate stack.

Additional advantages and features of the present invention will be apparent from the following detailed description and drawings which illustrate preferred embodiments of the invention.

DETAILED DESCRIPTION OF THE INVENTION

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention.

The term "substrate" is to be understood as a semiconductor-based material including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "substrate" in the following description, previous process steps may have been utilized to form regions or junctions in the base semiconductor structure or foundation. In addition, the semiconductor need not be silicon-based, but could be based on silicon-germanium, germanium, or gallium arsenide.

The term "pixel" refers to a picture element unit cell containing a photosensor and transistors for converting light radiation to an electrical signal. For purposes of illustration, a representative pixel is illustrated in the figures and description herein and, typically, fabrication of all pixels in an imager will proceed simultaneously in a similar fashion.

Figure 17:
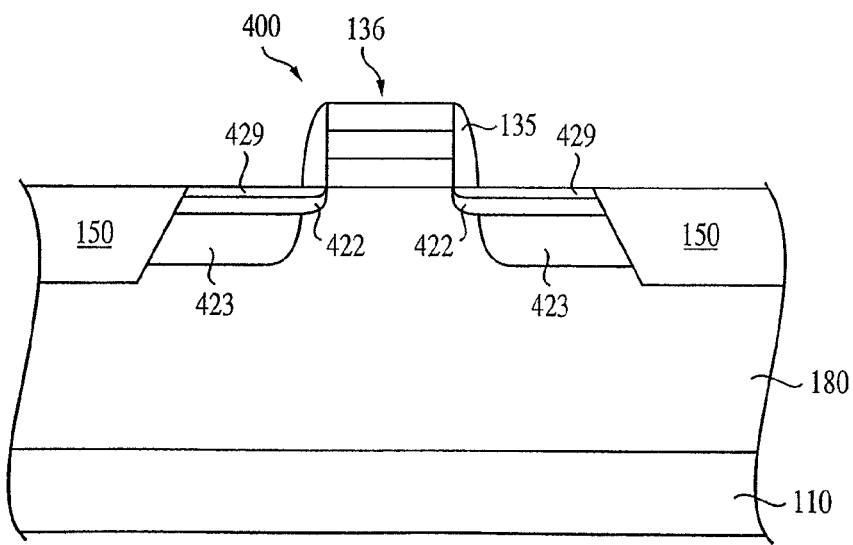
FIG. 17 illustrates a schematic cross-sectional view of the substrate of FIG. 3 at a stage of processing subsequent to that shown in FIG. 3 and in accordance with a fourth embodiment of the present invention.
Figure 18:
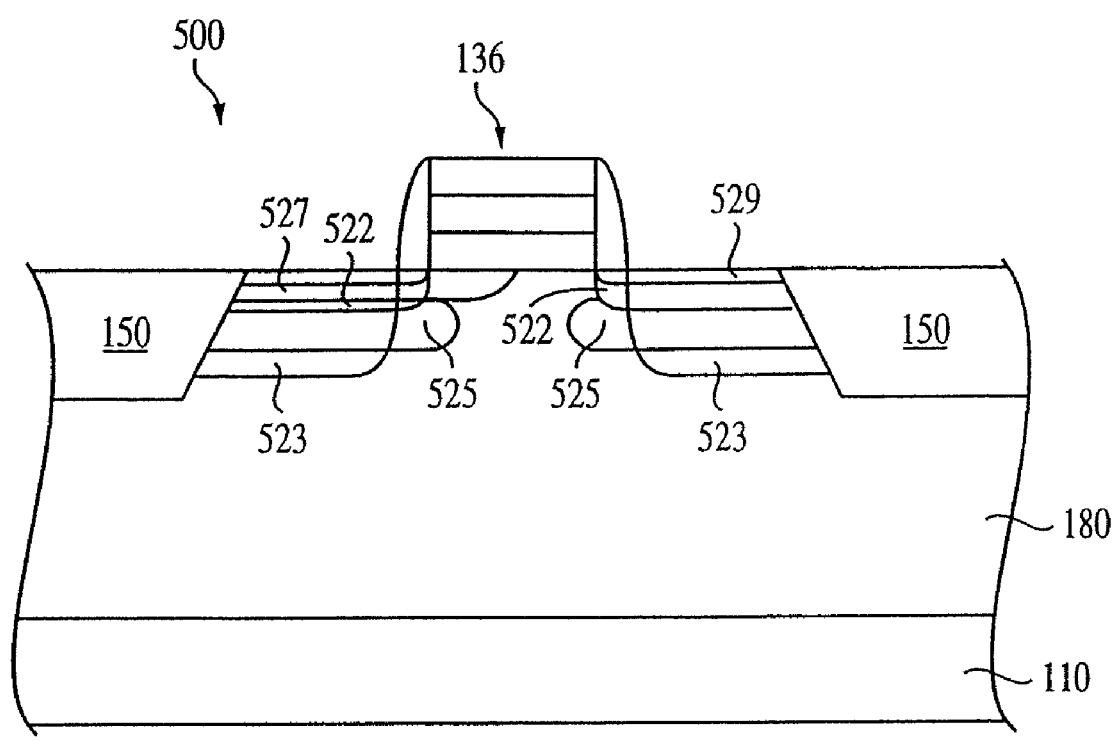
FIG. 18 illustrates a schematic cross-sectional view of the substrate of FIG. 3 at a stage of processing subsequent to that shown in FIG. 3 and in accordance with a fifth embodiment of the present invention.

Referring now to the drawings, where like elements are designated by like reference numerals, FIGS. 3-18 illustrate exemplary embodiments of methods of forming asymmetric transistor 100, 200, 300, 400, 500 (FIGS. 8, 11, 16, 17, 18) having a low threshold voltage Vt of about 0.3 V to about 0.7 V, more preferably of about 0.4 V to about 0.65 V, and as part of a three-transistor (3T) pixel sensor cell 101 (FIG. 18). Although the embodiment of this invention will be described below with reference to a 3T CMOS imager, this is not to be taken as limiting. Accordingly, the invention also contemplates 4T, 5T, 6T, 7T CMOS imagers and CCD imagers. CCD imagers also contain reset and source followers transistors to which the present invention applies.

As explained in detail below, the low threshold voltage transistor is formed by conducting only one heavy dosage implant in the substrate 110 and around the gate stack 136, and eliminating at least one of a halo implant, LDD implant or enhancement implant conventionally used in the formation of an n-channel transistor on at least one side of the gate stack 136. Other transistors of an imager device which contains a pixel with the transistor having the eliminated halo, enhancement or LDD implants, or any combination of the halo, enhancement and LDD implants, are fabricated with the conventional implants on opposite sides of the gate stacks. Accordingly, these transistors have a higher threshold voltage, typically about 0.8 V.

It should be noted that, although the invention will be described below with reference to the formation of a low threshold voltage transistor 100, 200, 300, 400, 500 (FIGS. 8, 11, 16, 17, 18), which for simplicity is a source follower transistor adjacent a row select and reset transistors of a 3T pixel cell 101 (FIG. 19), the invention is not limited to this embodiment and contemplates the formation of other low threshold voltage transistors used in a 3T, 4T, 5T, 6T or 7T pixel cell, as desired. Thus, it must be understood that the invention has equal applicability to the formation of a low threshold voltage transistor, which may be, for example, a source follower transistor, a row select transistor, a reset transistor, a transfer transistor, a dual conversion gain transistor, a high dynamic range transistor, or a global shutter transistor, among others, and as part of an active pixel cell of a CMOS imager or a CCD imager.

Figure 1:
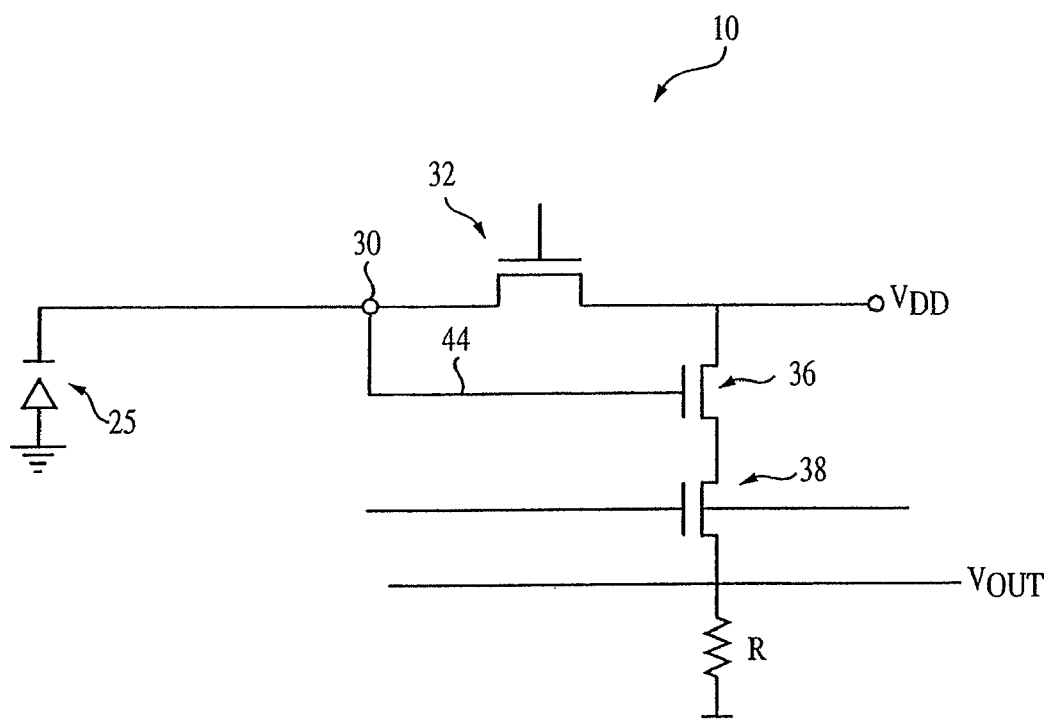
FIG. 1 illustrates a schematic diagram of a pixel sensor cell of the prior art.
Figure 2:
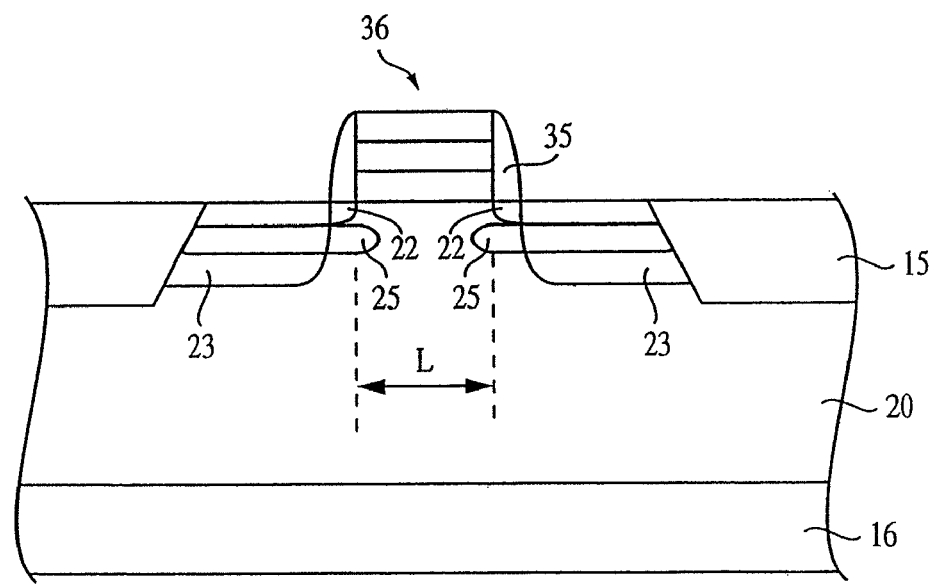
FIG. 2 is another schematic part cross-sectional substrate view of the source follower transistor of the pixel sensor cell of FIG. 1.
Figure 3:
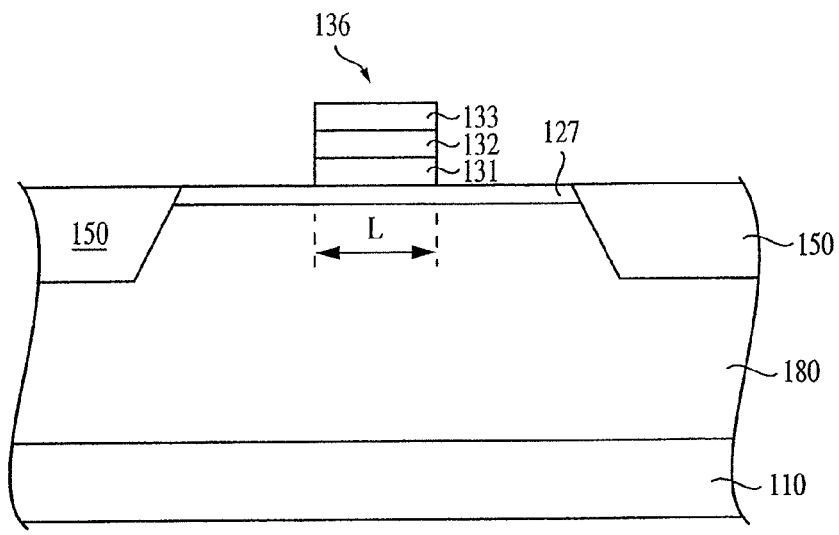
FIG. 3 illustrates a schematic part cross-sectional view of the substrate of FIG. 2, illustrating a source follower transistor at an initial stage of processing and in accordance with an embodiment of the present invention.
Figure 6:
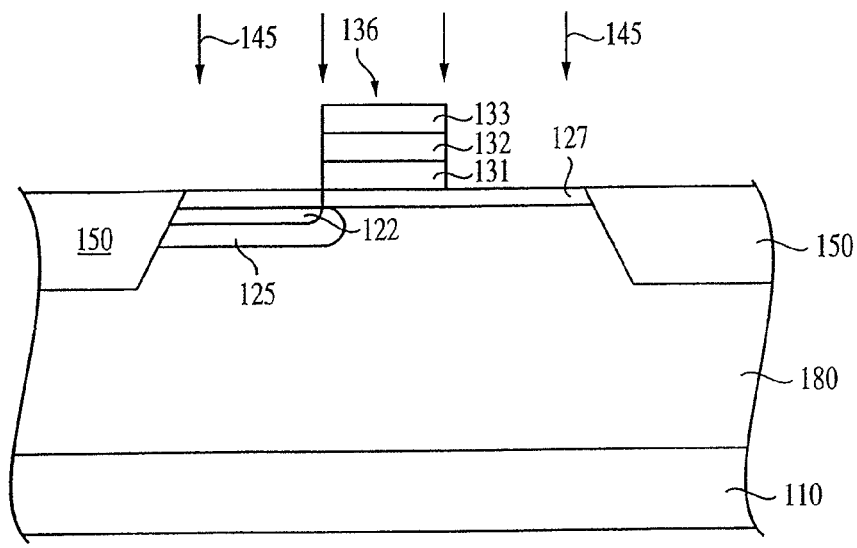
FIG. 6 illustrates a schematic cross-sectional view of the substrate of FIG. 3 at a stage of processing subsequent to that shown in FIG. 5.
Figure 7:
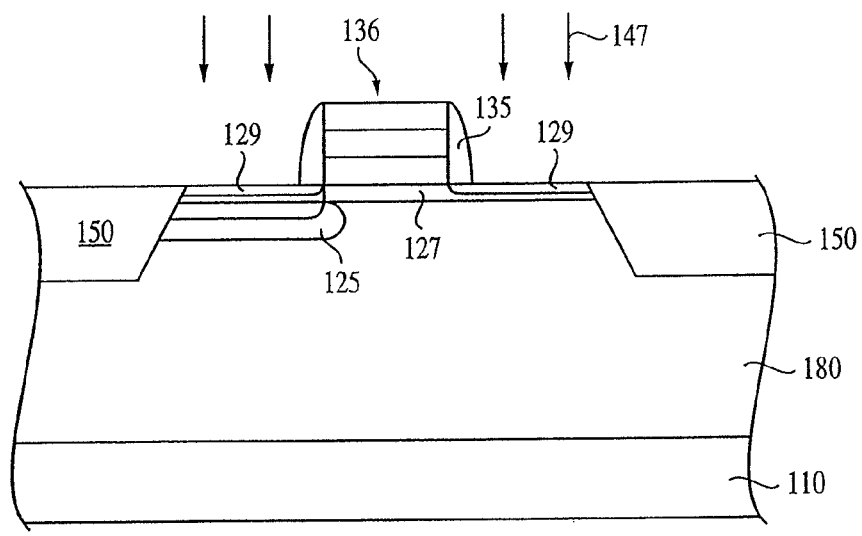
FIG. 7 illustrates a schematic cross-sectional view of the substrate of FIG. 3 at a stage of processing subsequent to that shown in FIG. 6.
Figure 8:
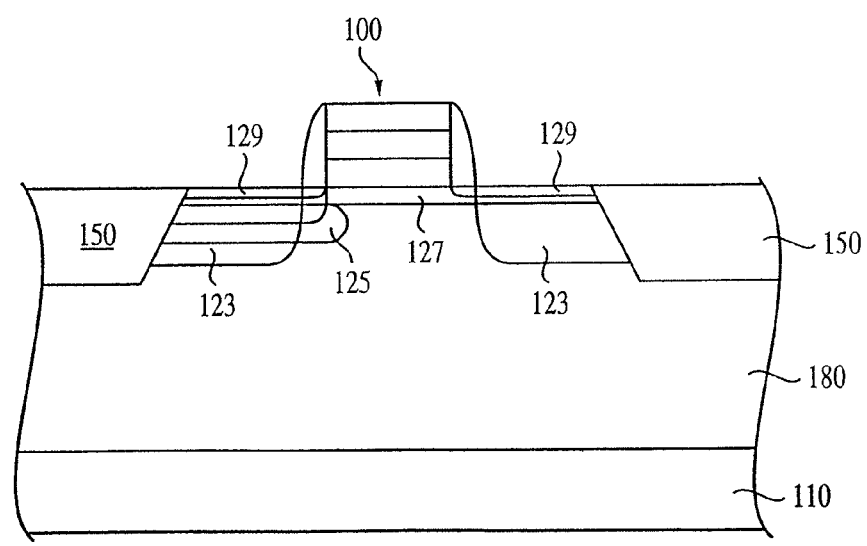
FIG. 8 illustrates a schematic cross-sectional view of the substrate of FIG. 3 at a stage of processing subsequent to that shown in FIG. 7.

Reference is now made to FIGS. 3-8, which illustrate a first exemplary embodiment of the present invention according to which asymmetric LDD/halo devices, such as asymmetric transistor 100 of FIG. 8, are formed having implants on one side of the device different from implants on the other side of the device. FIG. 3 illustrates multi-layered gate stack 136 formed over substrate base 110 of a first conductivity type, which for exemplary embodiments is a p-type, along a cross-sectional view which is the same view as in FIG. 2. The multi-layered gate stack 136 may be, for example, a gate stack of a reset transistor or of a source follower transistor of a CMOS imager, or of a source follower transistor of a CCD imager. Although, for simplicity, reference to the gate stack 136 will be made in this application as to source follower gate stack 136, it must be understood that this example is not limiting and the gate stack may be of any source follower transistor, row select transistor, reset transistor, transfer transistor, dual conversion gain transistor, high dynamic range transistor, or global shutter transistor.

The substrate base 110 may be provided with the wafer. Instead of a substrate base 110 of the first conductivity type, a base layer of a first conductivity type that is implanted by conventional methods may be provided, or grown by epitaxial growth. For simplicity, the substrate base 110 is provided with the wafer and is preferably a lightly doped p-epi on a highly doped p+ silicon substrate base 110. The doping of the p-epi region is about $3\times10^{14}$ to $1\times10^{16}$ boron/cm$^3$. The p+ region is highly doped and has a resistivity of 0.1 Ω-cm to 0.001 Ω-cm. Lightly doped p-type silicon wafer may be also used with a doping of about $3\times10^{14}$ to $1\times10^{16}$ boron/cm$^3$.

Figure 13:
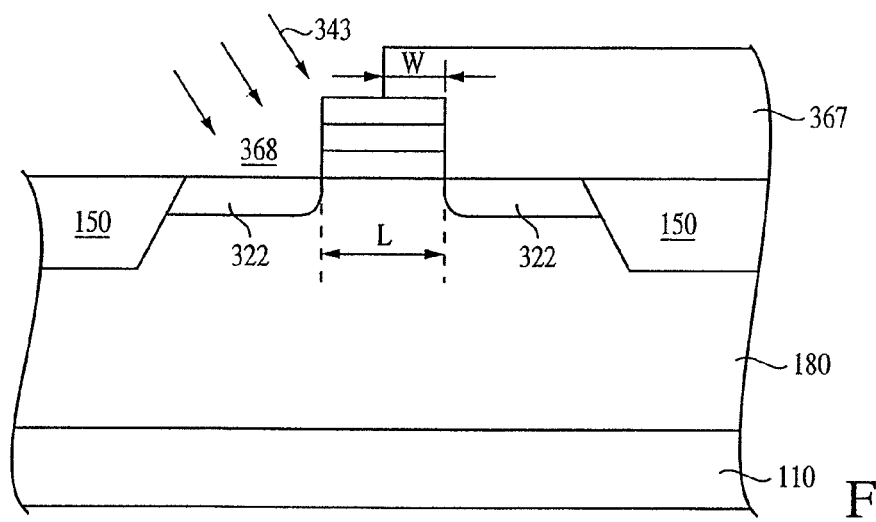
FIG. 13 illustrates a schematic cross-sectional view of the substrate of FIG. 12 at a stage of processing subsequent to that shown in FIG. 12.
Figure 14:
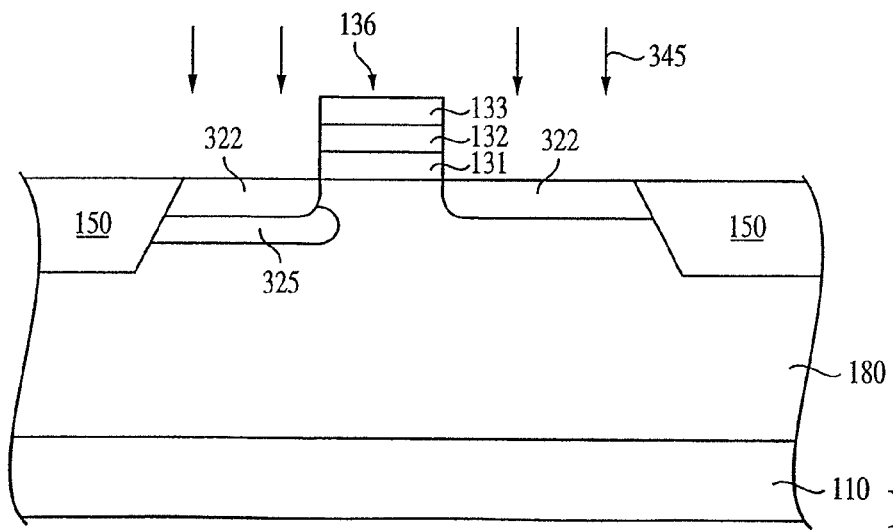
FIG. 14 illustrates a schematic cross-sectional view of the substrate of FIG. 12 at a stage of processing subsequent to that shown in FIG. 13.
Figure 15:
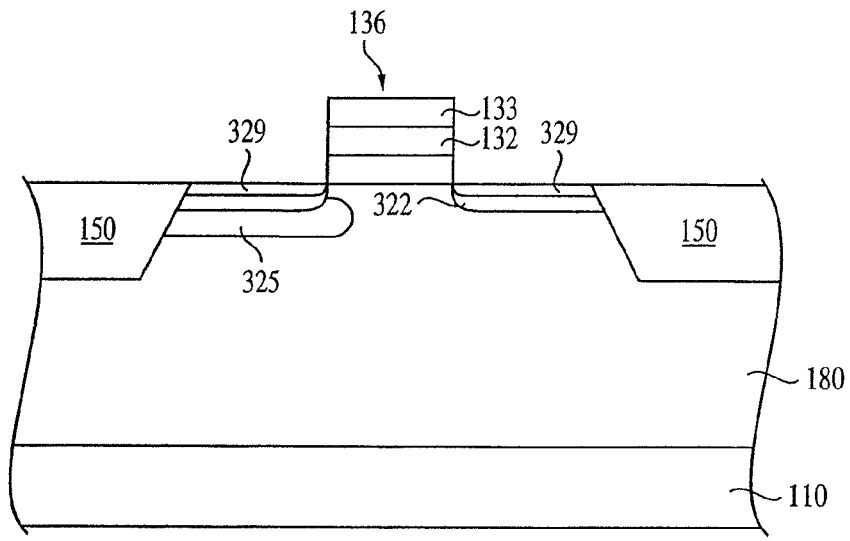
FIG. 15 illustrates a schematic cross-sectional view of the substrate of FIG. 12 at a stage of processing subsequent to that shown in FIG. 14.

As shown in FIG. 13, the source follower gate stack 136 comprises a first gate oxide layer 131 of grown or deposited silicon oxide, or of deposited high k insulator, on the silicon substrate 110, a conductive layer 132 of doped polysilicon or other suitable conductor material, and a second insulating layer 133, which may be formed of, for example, silicon oxide (silicon dioxide), nitride (silicon nitride), oxynitride (silicon oxynitride), ON (oxide-nitride), NO (nitride-oxide), or ONO (oxide-nitride-oxide). The first and second insulating layers 131, 133 and the conductive layer 132 may be formed by conventional deposition methods, for example, chemical vapor deposition (CVD) or plasma enhanced chemical vapor deposition (PECVD), among many others. While the second insulating layer 133 is advantageous, it is not required to enable this invention.

Typically, after pad oxidation or after polysilicon deposition, a blanket or masked enhancement implant may occur to set the transistor Vt. For n-channel devices, the enhancement implant is a p-type B or BF$_2$ implant. The implant dose is about $5\times10^{11}$/cm$^2$ to $1\times10^{13}$/cm$^2$, more preferably $1\times10^{12}$/cm$^2$ to $6\times10^{12}$/cm$^2$. Blanket enhancement implant region 127 is illustrated in FIG. 3 and may be formed after pad oxidation, prior to gate oxidation, or after polysilicon deposition.

If desired, a silicide layer (not shown) may be also formed in the multi-layered gate stack 136 between the conductive layer 132 and the second insulating layer 133. Advantageously, the gate structures of all other transistors in the imager circuit design may have this additionally formed silicide layer. This silicide layer may be titanium silicide, tungsten silicide, cobalt silicide, molybdenum silicide, or tantalum silicide. The silicide layer could also be a barrier layer/refractory metal such as TiN/W or $WN_x/W$ or it could be entirely formed of $WN/_x$.

Figure 19:
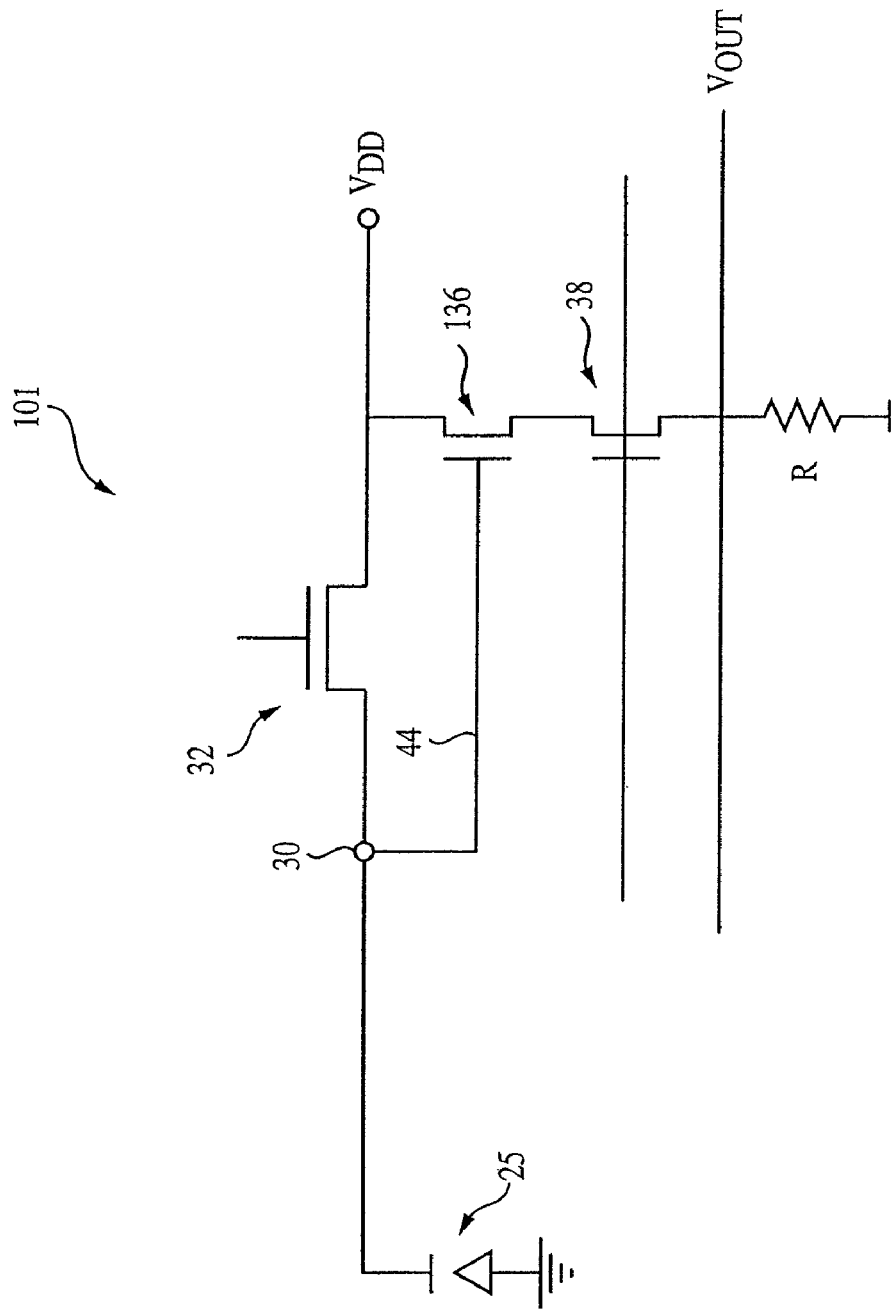
FIG. 19 is a schematic diagram of a pixel sensor cell comprising the source follower transistor formed according to the first embodiment of the present invention.

FIG. 3 also illustrates field oxide regions 150 which serve to surround and isolate the later formed pixel sensor cell 101 (FIG. 19). The field oxide regions 150 may be formed by etching trenches in the silicon substrate 110 and then filling the trenches with oxide (STI), or by chemical vapor deposition of an oxide material, or by other known technique including a LOCOS process.

Also shown in FIG. 3 is the p-well implant 180. The p-well may be formed from multiple p-type implants either before or after the gate stack formation. The p-well implant dose is of about $1 \times 10^{12}$ ions/cm$^2$ to $5 \times 10^{13}$ ions/cm$^2$.

Figure 4:
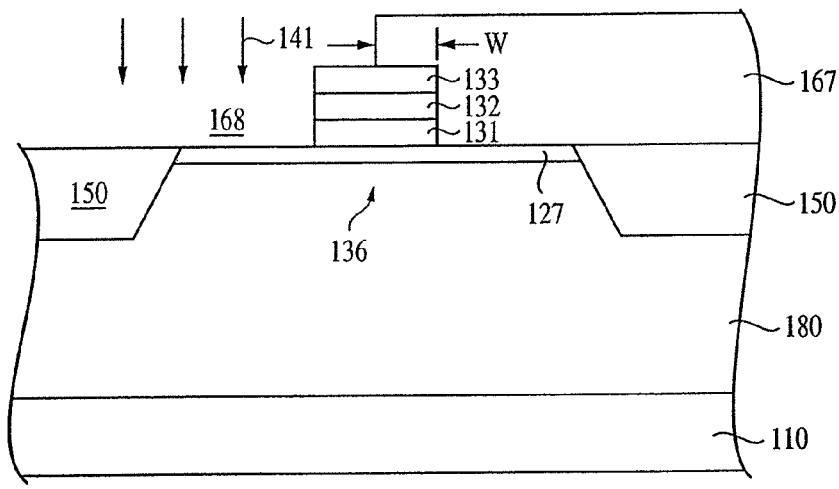
FIG. 4 illustrates a schematic cross-sectional view of the substrate of FIG. 3 at a stage of processing subsequent to that shown in FIG. 3.

Subsequent to the formation of the gate 136, a photoresist layer 167 (FIG. 4) is formed over the substrate 110 and the source follower gate 136 to a thickness of about 1,000 Angstroms to about 10,000 Angstroms. The photoresist layer 167 (FIG. 4) is patterned with a mask (not shown) to obtain an opening 168 (FIG. 4) which, on the right side, extends over the gate 136 by an offset distance W, as illustrated in FIG. 4. The offset distance W is not critical for this embodiment and is shown centered on the gate 136.

Figure 5:
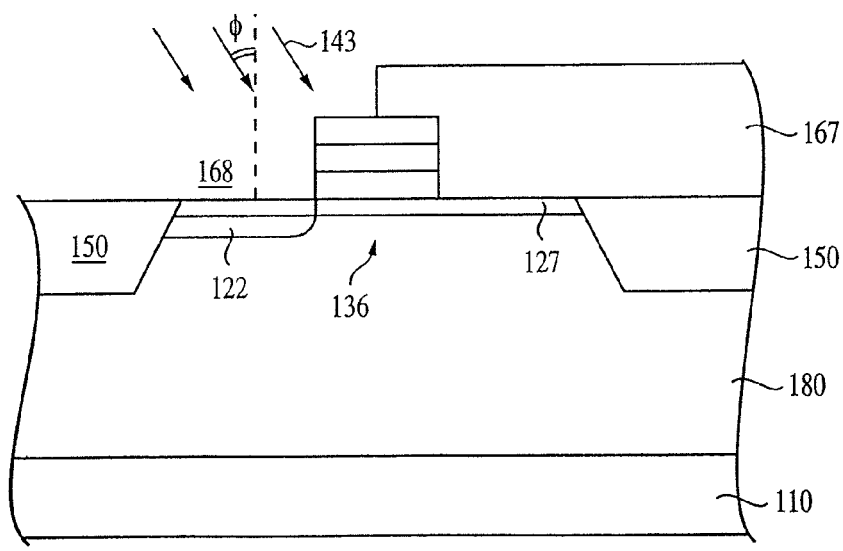
FIG. 5 illustrates a schematic cross-sectional view of the substrate of FIG. 3 at a stage of processing subsequent to that shown in FIG. 4.

Next, the structure of FIG. 4 is subjected to a first masked dopant implantation 141 (FIG. 4) with a dopant of a second conductivity type, which for exemplary purposes is n-type, in the area of the substrate 110 directly beneath the opening 168. Ion implantation may be conducted by placing the silicon substrate 110 in an ion implanter, and implanting appropriate n-type dopant ions, preferably arsenic, into the substrate 110 to form n-type lightly doped drain (LDD) region 122 on only one side (i.e., the left side) of the gate stack 136, as illustrated in FIG. 5. The dosage for the n-type lightly doped drain (LDD) region 122 (FIG. 5) is within $2 \times 10^{12}$/cm$^2$ to $3 \times 10^{13}$/cm$^2$, more preferably $4 \times 10^{12}$/cm$^2$ to $1 \times 10^{13}$/cm$^2$. Thus, for the purposes of the present invention, this n-type region forms and defines "lightly doped drain region" or "LDD region." The n-type lightly doped drain (LDD) region 122 is self-aligned to the left edge of the source follower transistor gate 136 and may be implanted normal to the substrate or at an angle.

Subsequent to the first masked dopant implantation 141, the structure of FIG. 5 is subjected to a second angled dopant implantation 143 (FIG. 5) with a dopant of the first conductivity type, which as noted above is p-type, to form a p-type halo implanted region 125 located below the n-type LDD region 122, and extending slightly below the gate stack 136. P-type dopants such as boron (B) or boron difluoride ($BF_2$) may be implanted within opening 168 at an angle "ø" within a range of about 5 to about 40 degrees, depending on the gate stack height, the spacing between the gate stacks and the minimum gate length. The angle ø is measured with respect to the substrate normal, i.e., an implant normal to the substrate is defined as zero degrees.

Subsequent to the formation of the p-type halo implanted region 125 of FIG. 6, the photoresist layer 167 (FIG. 5) is removed by conventional techniques. The structure of FIG. 5 may be subjected to a blanket implantation, preferably with arsenic, antimony or phosphorous, at a dose of about $1 \times 10^{12}$/cm$^2$ to $1 \times 10^{13}$/cm$^2$, more preferably about $5 \times 10^{12}$/cm$^2$, to obtain n-type implanted regions 129, illustrated in FIG. 7.

Insulating sidewall spacers 135 are then formed on both sides of the source follower transistor gate 136, as also illustrated in FIG. 7. The sidewall spacers 135 may be formed, for example, of silicon dioxide, silicon nitride, silicon oxynitride, ON, NO, ONO or TEOS, among others.

The structure of FIG. 7 is then subjected to a dopant implantation 147 (FIG. 7) with a dopant of the second conductivity type, which for exemplary purposes is n-type, to form source and drain regions 123 around both sides of the gate 136 of source follower transistor 100, as illustrated in FIG. 8. N-type dopants such as arsenic, antimony, or phosphorous may be employed. The implant dose in the source and drain regions 123 is within the range of about $1 \times 10^{15}$ to about $1 \times 10^{16}$ atoms per cm$^2$. The source and drain implants are self-aligned to the sidewall spacers 135.

By subjecting the source follower transistor 100 to a heavy dosage implant on both sides of the gate stack 136, such as the source/drain implant 147 (FIG. 7), and by eliminating the LDD implant 141 (FIG. 4) and the halo implant 143 (FIG. 5) from one side of the gate stack (i.e., the right side), the threshold voltage Vt of the asymmetric source follower transistor 100 is substantially reduced to a lower threshold voltage than that of an adjacent row select transistor and other like-formed transistors of an imager device containing the pixel cell under fabrication, in which these implants are symmetrically placed on both sides of the transistor. For the purposes of the present invention, the term "low threshold voltage" is defined as a threshold voltage of about 0.3 V to less than about 0.7 V, more preferably to about 0.4 to about 0.65 V.

When the threshold voltage of a transistor is reduced, however, the subthreshold slope of the short-channel device starts to degrade as the surface potential is more controlled by the drain than by the gate. In this manner, the source follower transistor 100 may undesirably reach a "punch-through" condition when the gate electrode 136 totally loses control of the channel, high drain current persists independent of gate voltage, and the source follower transistor 100 bears the maximum voltage. Nevertheless, because the low threshold voltage source follower transistor 100 is electrically connected in series to the row select transistor 38 (as shown in FIG. 19), the degradation in the "punch-through" protection of the low threshold voltage source follower transistor 100 is insignificant, as voltage is distributed proportionately across the row select transistor 38 and the source follower transistor 100. Thus, although by reducing the threshold voltage Vt of the source follower transistor 100 the "punch-through" protection of the source follower transistor 100 is proportionately reduced, this disadvantage is insignificant because of the serially connected row select transistor.

In FIGS. 1-8, we described the formation of an asymmetric low Vt transistor in which these low Vt transistors receive a blanket enhancement implant but in which implants on one side of the transistor gate are different from the implants on the other side of the transistor gate. FIGS. 9-18 illustrate yet other embodiments of the present invention, according to which exemplary asymmetric transistors 200 (FIG. 11), 300 (FIG. 16), 400 (FIGS. 17) and 500 (FIG. 18) are formed according to methods of the present invention.

Figure 9:
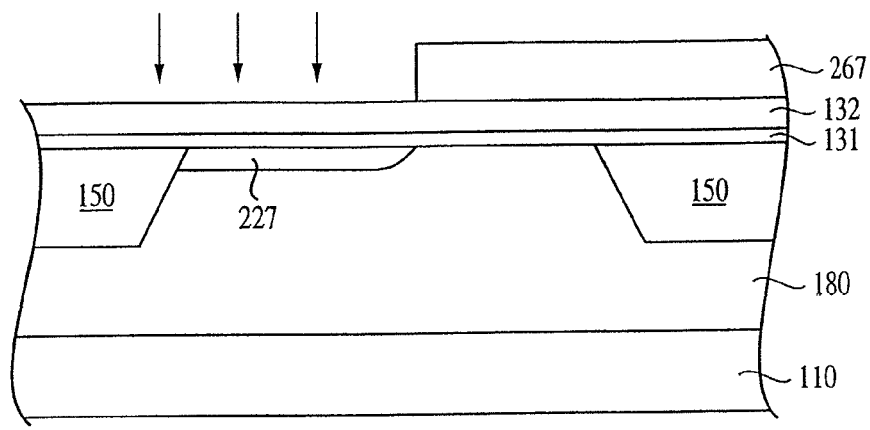
FIG. 9 illustrates a schematic cross-sectional view of the substrate of FIG. 3 at an initial stage of processing subsequent and in accordance with a second embodiment of the present invention.
Figure 10:
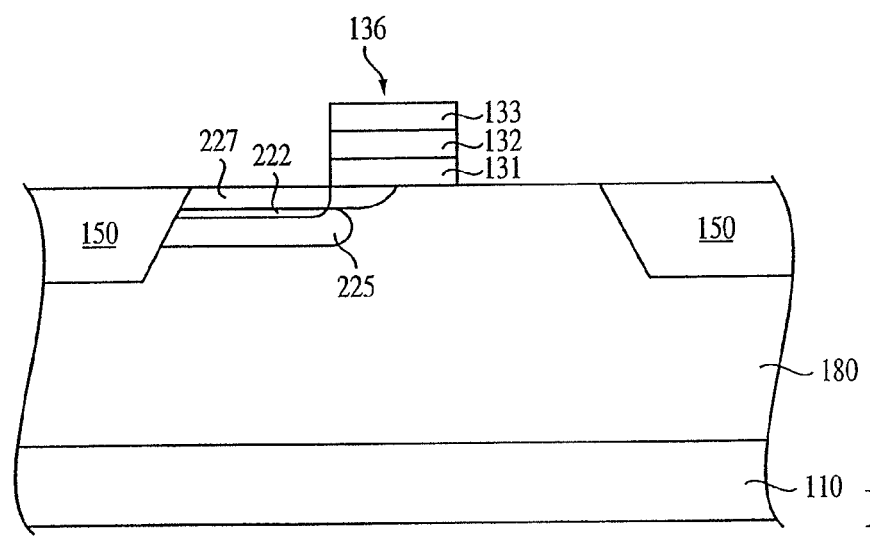
FIG. 10 illustrates a schematic cross-sectional view of the substrate of FIG. 9 at a stage of processing subsequent to that shown in FIG. 9.
Figure 11:
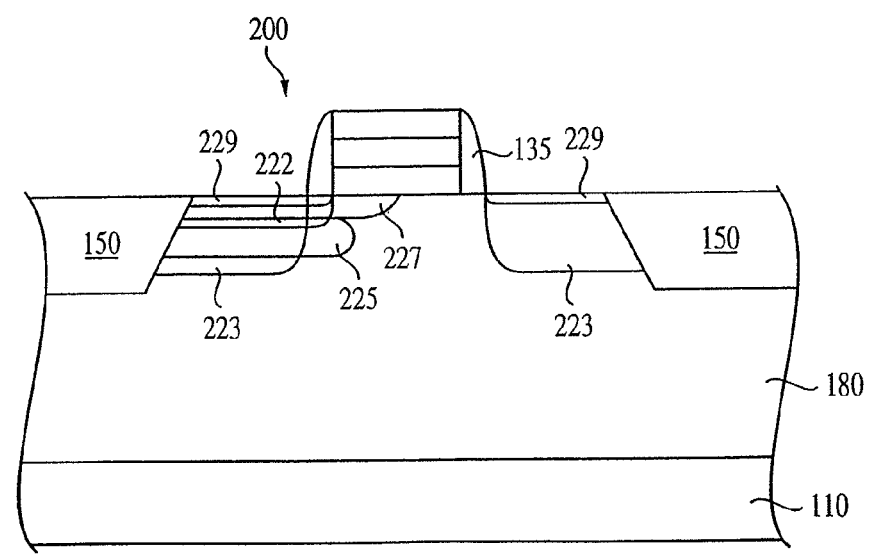
FIG. 11 illustrates a schematic cross-sectional view of the substrate of FIG. 9 at a stage of processing subsequent to that shown in FIG. 10.

For example, FIGS. 9-11 illustrate a second embodiment of the present invention, according to which asymmetric transistor 200 (FIG. 11) is formed similar to the transistor 100 (FIG. 8), except that the enhancement implant is masked on at least one side of the gate stack of the transistor. Asymmetric transistor 200 has the halo implant, LDD implant and enhancement implant eliminated from one side (i.e., the right side) of the gate stack 136.

As shown in FIG. 9, a portion of the enhancement implant can be masked. The masked enhancement implant may be conducted after the padox, gateox, sacox, or polysilicon deposition. FIG. 9 illustrates the masked enhancement implant conducted after the deposition of gate oxide layer 131 and of the polysilicon layer 132. In FIG. 9, a photoresist layer 267 is formed and patterned over the substrate 110 so that right side of the gate stack 136 is blocked from the enhancement implant. Masked enhancement implant region 227 is illustrated in FIG. 10, together with LDD region 222 and halo implanted region 225. The completed transistor 200, with the masked enhancement implant region 227 and source and drain regions 223, is shown in FIG. 11.

Figure 12:
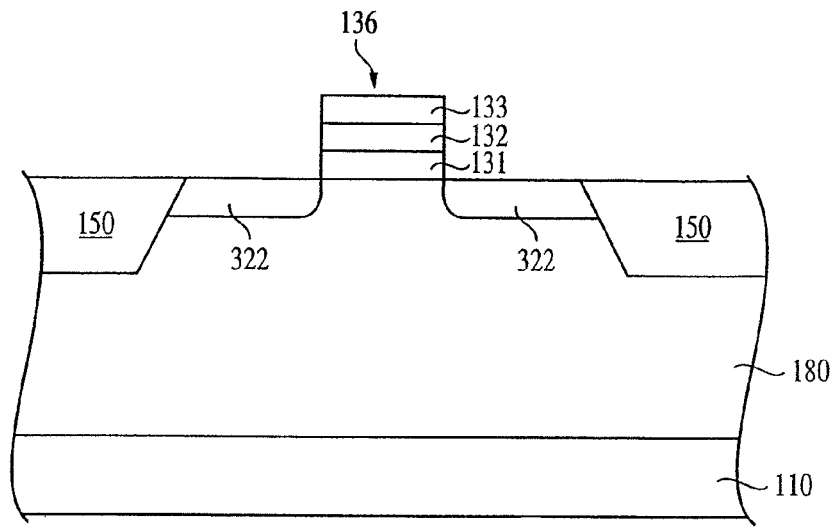
FIG. 12 illustrates a schematic cross-sectional view of the substrate of FIG. 3 at a stage of processing subsequent to that shown in FIG. 3 and in accordance with a third embodiment of the present invention.

FIGS. 12-16 illustrate yet a third embodiment of the present invention according to which asymmetric transistor 300 (FIG. 16) is provided with an omitted halo implant region on one side (i.e., the right side) of the gate stack 136. While the halo implanted region is omitted on one side of the transistor gate stack, asymmetric transistor 300 may be optionally formed with a blanket enhancement implant (such as blanket enhancement implant 127 of Figure a masked enhancement implant (such as masked enhancement implant 227 of FIG. 10) and/or with LDD regions (such as LDD regions 122 of FIG. 5) on one or both sides of the gate stack. For example, FIG. 12 illustrates an exemplary embodiment with n-type lightly doped drain (LDD) regions 322 formed on both sides of the gate stack 136 but with the enhancement implant masked from both sides of the gate stack 136. The dosage for the n-type lightly doped drain (LDD) regions 322 is within $2\times10^{12}/cm^2$ to $3\times10^{13}/cm^2$. The n-type lightly doped drain (LDD) regions 322 are self-aligned to the left edge of the source follower transistor gate 136.

Next, a photoresist layer 367 is formed and patterned over the substrate 110 and the source follower gate 136 to obtain an opening 368 (FIG. 13) which, on the right side, extends over the source follower gate 136 by a non-critical offset distance W of about 50% the length L of the source follower gate 136, as illustrated in FIG. 13. The structure of FIG. 13 is subjected to a masked angled dopant implantation 343 (FIG. 13) with a dopant of the first conductivity type, which as noted above is p-type, to form a p-type halo implanted region 325 located below the left n-type LDD region 322, and extending slightly below the gate stack 136. P-type dopants such as boron (B) or boron difluoride ($BF_2$) may be implanted within opening 368 at an angle "ø" with respect to a line perpendicular to the surface of the substrate 110, as explained in detail above with reference to FIG. 5. Implanted regions 329 (FIG. 15) and source/drain regions 323 are subsequently formed on both sides of the gate stack 136 to complete the formation of the asymmetric source follower transistor 300 of FIG. 16.

Figure 16:
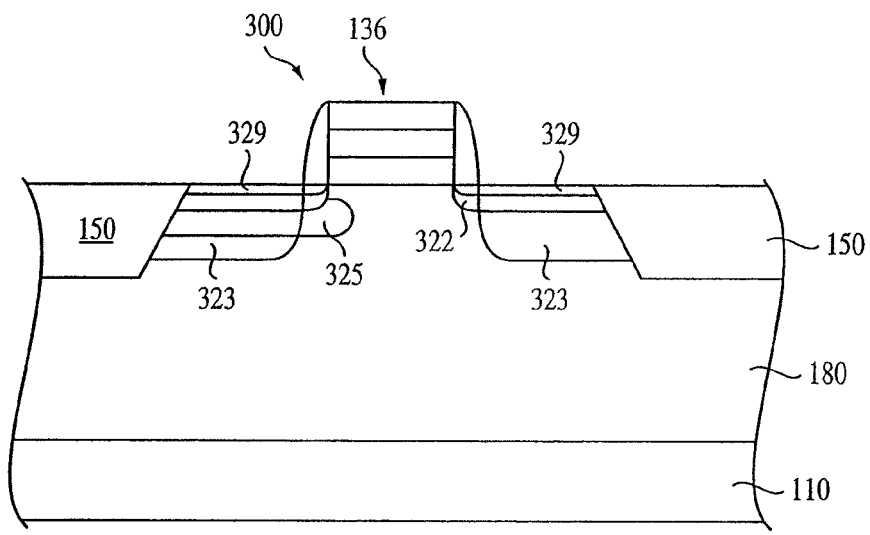
FIG. 16 illustrates a schematic cross-sectional view of the substrate of FIG. 12 at a stage of processing subsequent to that shown in FIG. 15.

FIG. 17 illustrates yet a fourth exemplary embodiment of the present invention according to which the halo implanted regions are eliminated from both sides of the gate stack 136 of asymmetric transistor 400. Accordingly, and as illustrated in FIG. 17, only LDD regions 422, implanted regions 429 and source/drain regions 423 are formed on both sides of the gate stack 136 by similar methods described above for the formation of corresponding structures of the source follower transistors 100 (FIG. 8), 200 (FIG. 11) and 300 (FIG. 16).

FIG. 18 illustrates yet a fifth embodiment of the present invention, according to which an enhancement implant is masked from at least one side of the gate stack 136 of asymmetric transistor 500. As illustrated in FIG. 18, LDD regions 522 and halo implanted regions 525 are formed on both sides of the gate stack 136 of the transistor 500. However, the enhancement implant is blocked from the right side of the gate stack 136, so that only masked enhancement implant region 527 is formed by a method similar to that described above with reference to FIGS. 9-11.

FIG. 19 illustrates a schematic diagram of a 3T pixel sensor cell 101 comprising the asymmetric source follower transistor 100 formed according to the first embodiment of the present invention, the formation of which was explained above with reference to FIGS. 3-8. The remaining devices of the pixel sensor cell 101, including the reset transistor 32 and row select transistor 38 with source/drain regions on either sides of the gates are also formed. One or both of these transistors may be formed by omitting at least one of a halo implant, enhancement implant and LDD implant on one or both sides of a gate, as in the case of the source follower transistor 100, where both halo and LDD implants are omitted. Alternatively, one or both of transistors 32, 38 may be fabricated with halo, enhancement and LDD implants on both sides of the gate in a conventional manner.

Conventional processing steps may be employed to form contacts and wiring to connect transistor gate and source and drain regions of the now-defined pixel cell 101. For example, the entire surface may be covered with a passivation layer of, e.g., silicon dioxide, BSG, PSG, or BPSG, which is CMP planarized and etched to provide contact holes, which are then metallized to provide contacts to the reset gate, transfer gate, source/drain regions and other pixel structures, as needed. Conventional multiple layers of conductors and insulators to other circuit structures may also be used to interconnect the internal structures of the pixel sensor cell and to connect the pixel cell structures to other circuitry associated with the pixel array.

The structures described and illustrated above in FIGS. 3-18 are only illustrative of the invention. The present invention also contemplates the formation of other types of asymmetric transistors having any combination of omitted implants from at least one side of the gate stack.

Figure 20:
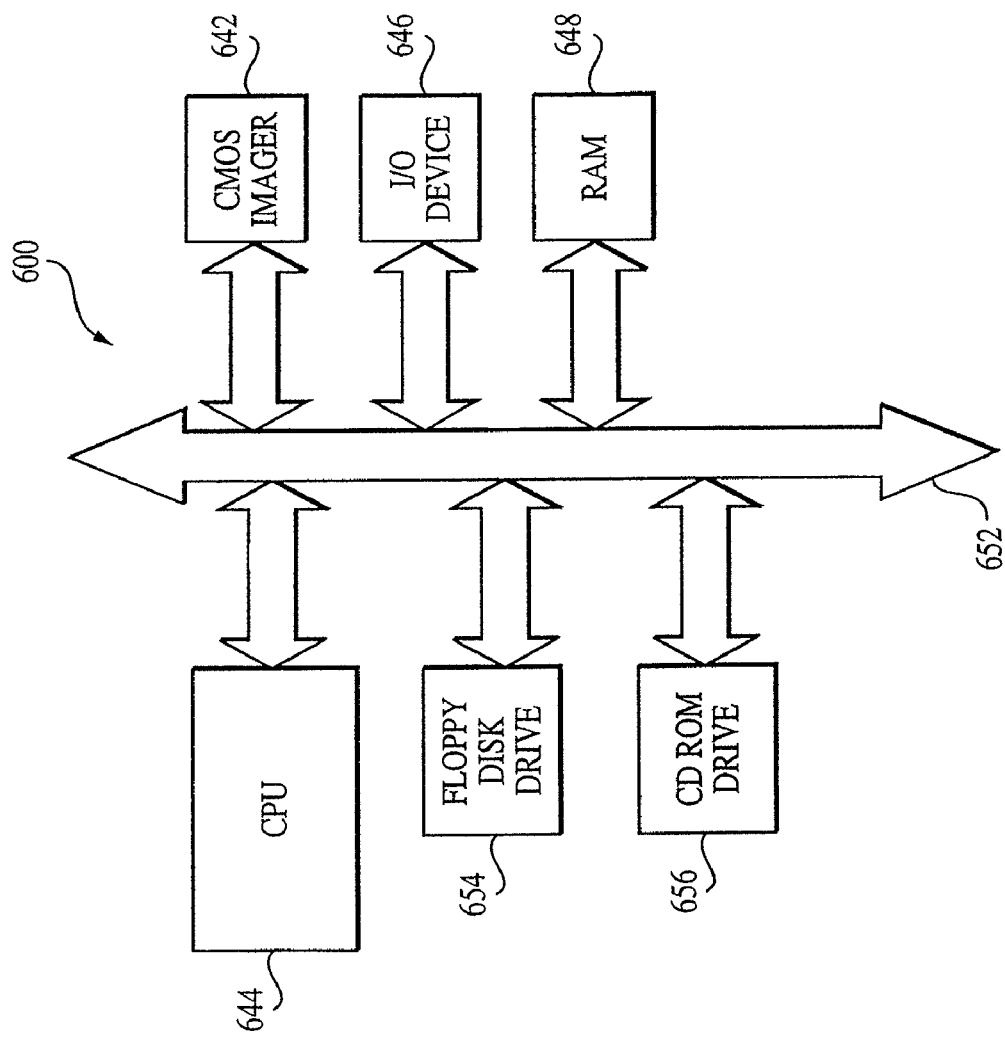
FIG. 20 is an illustration of a processing system utilizing the pixel sensor cells of the present invention.

The structures described and illustrated above in FIGS. 8, 11, 16, 17 and 18 may be incorporated in the pixel cells of a pixel array of a CMOS imager device 642 (FIG. 20), which provides a real time or stored image output. The imager device 642 may, in turn, be connected to a processor based system 600, also illustrated in FIG. 20. A processor based system is exemplary of a system having digital circuits which could receive and process signals from CMOS imager 642. Without being limiting, such a system could include a computer system, camera system, scanner, machine vision, vehicle navigation, video phone, surveillance system, auto focus system, star tracker system, motion detection system, image stabilization system and data compression system for high-definition television, all of which can utilize the present invention.

A processor based system, such as a computer system, for example generally comprises a central processing unit (CPU) 644, for example, a microprocessor, that communicates with an input/output (I/O) device 646 over a bus 652. The CMOS imager 642 communicates with the system over bus 652. The computer system 600 also includes random access memory (RAM) 648, and may include peripheral devices such as a floppy disk drive 654, and a compact disk (CD) ROM drive 656 or a flash memory card 657 which also communicate with CPU 644 over the bus 652. It may also be desirable to integrate the processor 654, CMOS image sensor 642 and memory 648 on a single IC chip.

The structures described and illustrated above in FIGS. 8, 11, 16, 17 and 18 may be incorporated in the pixel cells of a CMOS imager device together with other structures of a pixel cell, for example, with a photoconversion device, such as a photodiode, photogate or photoconductor. If a photodiode is desired, the photodiode may be a buried photodiode formed below a surface of substrate 110, for example a buried p-n-p photodiode, buried n-p-n photodiode, a buried p-n photodiode or a buried n-p photodiode, among others. The present invention also contemplates embodiments in which other low threshold voltage transistors are formed in a pixel cell, for example a low threshold voltage transfer transistor which may be formed adjacent a buried photodiode of an active pixel cell of a CMOS imager.

Although the above embodiments have been described with reference to the formation of n-channel devices, such as the n-channel source follower transistors 100, 200, 300, 400, 500 it must be understood that the invention is not limited to this embodiment. Accordingly, the invention has equal applicability to p-channel devices formed within an n-type deep implanted region formed below a transistor array. Of course, the dopant and conductivity type of all structures will change accordingly, with the gate of the source follower transistor corresponding to a PMOS transistor.

In addition, although the invention has been described above with reference to a source follower transistor of a pixel cell, the invention has applicability to any type of transistor which is part of an active pixel cell, such as a reset transistor, a transfer transistor, a row select transistor, a dual conversion gain transistor, a high dynamic range transistor, or a global shutter transistor. Further, the invention also contemplates the formation of more than one low threshold voltage transistors as part of an active pixel cell of a CMOS imager, each of the low threshold voltage transistors being fabricated as described above and having various threshold voltages. The invention further contemplates the formation of multiple active pixels, each of them individually comprising one or more low threshold voltage transistors and formed as described above. Thus, the described embodiments are only exemplary and the invention contemplates the formation of multiple Vt transistors as part of active pixel cells of a CMOS imager or a CCD imager.

Further, although the invention has been described above with reference to a source follower gate of a source follower transistor connection for use in a three-transistor (3T) pixel cell having reset and row select transistors in addition to the source follower transistor, the invention also has applicability to a 4T, 5T, 6T or 7T cell, among others. In addition, although the invention has been described above with reference to the formation of asymmetric transistors as part of a CMOS imager, the invention has equal applicability to the formation of asymmetric transistors as part of a CCD imager, a global shutter transistor, a high dynamic range transistor, or a dual conversion gain transistor, among others.

The above description and drawings are only to be considered illustrative of exemplary embodiments, which achieve the features and advantages of the invention. Modification and substitutions to specific process conditions and structures can be made without departing from the spirit and scope of the invention. Accordingly, the invention is not to be considered as being limited by the foregoing description and drawings, but is only limited by the scope of the appended claims.

What is claimed as new and desired to be protected by Letters Patent of the United States is:

1. A pixel cell of an imaging device comprising:
   at least one transistor over a semiconductor substrate of a first conductivity type, the at least one transistor having a threshold voltage lower than a threshold voltage of another transistor of the pixel cell also formed over the semiconductor substrate, wherein the threshold voltage of the at least one transistor is in the range of about 0.3 V to less than 0.7 V.

2. The pixel cell of an imaging device according to claim 1, wherein the threshold voltage of the at least one transistor is in the range of about 0.4 V to about 0.65 V.

3. The pixel cell of an imaging device according to claim 1, wherein the at least one transistor and the another transistor are independently selected from the group consisting of a source follower transistor, a row select transistor, a reset transistor, a dual conversion gain transistor, a high dynamic range transistor, a transfer gate transistor and a global shutter transistor.

4. The pixel cell of an imaging device according to claim 1, wherein the pixel cell is one of a 3T, 4T, 5T, 6T and 7T pixel cell.

5. The pixel cell of an imaging device according to claim 1, wherein the pixel cell is a CMOS pixel cell.

6. The pixel cell of an imaging device according to claim 1, wherein the pixel cell is a CCD pixel cell.

7. A pixel cell of an imaging device comprising:
   a reset transistor over a semiconductor substrate of a first conductivity type, the reset transistor having a threshold voltage lower than a threshold voltage of a source follower transistor of the pixel cell also formed over the semiconductor substrate, wherein the threshold voltage of the reset transistor is in the range of about 0.3 V to less than 0.7 V.

8. The pixel cell of an imaging device according to claim 7, wherein the pixel cell is one of a 3T, 4T, 5T, 6T and 7T pixel cell.

9. The pixel cell of an imaging device according to claim 7, wherein the threshold voltage of the reset transistor is in the range of about 0.4 V to about 0.65 V.

10. The pixel cell of an imaging device according to claim 7, wherein the threshold voltage of the source follower transistor is about 0.7 V.

11. A processor system comprising:
    a processor; and
    an imaging device coupled to the processor, the imaging device comprising:
      an imaging pixel array comprising a plurality of pixel cells with at least one transistor over a semiconductor substrate of a first conductivity type, the at least one transistor having a threshold voltage lower than a threshold voltage of another transistor of the pixel cells also formed over the semiconductor substrate, wherein the threshold voltage of the at least one transistor is in the range of about 0.3 V to less than 0.7 V.

12. The processor system of claim 11, wherein the at least one transistor and the another transistor are independently selected from the group consisting of a source follower transistor, a row select transistor, a reset transistor, a dual conversion gain transistor, a high dynamic range transistor, a transfer gate transistor and a global shutter transistor.

13. The processor system of claim 12, wherein the at least one transistor is a reset transistor and the another transistor is a source follower transistor.

14. The processor system of claim 11, wherein the pixel cells are one of a 3T, 4T, 5T, 6T and 7T pixel cell.

15. The processor system of claim 11, wherein the imaging device is a CMOS imager.

16. The processor system of claim 11, wherein the imaging device is a CCD imager.

* * * * *